United States Patent
Jin et al.

(10) Patent No.: US 9,667,237 B2
(45) Date of Patent: May 30, 2017

(54) HARDWARE DELAY COMPENSATION IN DIGITAL PHASE LOCKED LOOP

(71) Applicant: Microsemi Semiconductor ULC, Kanata (CA)

(72) Inventors: Qu Gary Jin, Kanata (CA); Paul H. L. M. Schram, Bergen op zoom (NL); Krste Mitric, Ottawa (CA); Cathy Zhang, Ottawa (CA); Gabriel Rusaneanu, Ottawa (CA); Wenbao Wang, Kanata (CA)

(73) Assignee: MICROSEMI SEMICONDUCTOR ULC, Kanata, Ontario (CA)

( * ) Notice: Subject to any disclaimer, the term of this patent is extended or adjusted under 35 U.S.C. 154(b) by 0 days.

(21) Appl. No.: 15/064,663

(22) Filed: Mar. 9, 2016

(65) Prior Publication Data

US 2016/0294401 A1   Oct. 6, 2016

Related U.S. Application Data

(60) Provisional application No. 62/140,475, filed on Mar. 31, 2015.

(51) Int. Cl.
*H03L 7/06* (2006.01)
*H03K 5/135* (2006.01)
*H03L 7/093* (2006.01)
*H03L 7/07* (2006.01)
*H03L 7/08* (2006.01)
*H03L 7/081* (2006.01)
*H03L 7/085* (2006.01)
*H03K 5/00* (2006.01)

(52) U.S. Cl.
CPC ............... *H03K 5/135* (2013.01); *H03L 7/07* (2013.01); *H03L 7/081* (2013.01); *H03L 7/085* (2013.01); *H03L 7/0805* (2013.01); *H03L 7/093* (2013.01); *H03K 2005/00104* (2013.01); *H03L 2207/50* (2013.01)

(58) Field of Classification Search
CPC  H03K 5/135; H03K 2005/00104; H03L 7/07; H03L 7/0805; H03L 7/081; H03L 7/085; H03L 7/093; H03L 2207/50
USPC .......................................................... 327/150
See application file for complete search history.

(56) References Cited

U.S. PATENT DOCUMENTS

| | | | |
|---|---|---|---|
| 6,236,343 B1 | 5/2001 | Patapoutian | |
| 7,642,862 B2 * | 1/2010 | van der Valk | .......... H03L 7/085 331/18 |
| 2008/0122504 A1 * | 5/2008 | van der Valk | ........ H03L 7/0991 327/156 |

(Continued)

Primary Examiner — Ryan Jager
(74) Attorney, Agent, or Firm — Simon Kahn

(57) ABSTRACT

In a digital phase locked loop comprising a PLL loop including a first software-implemented controlled oscillator (SDCO) responsive to a control value to generate output phase and frequency values locked to a reference input signal, and a hardware-implemented controlled oscillator responsive to output phase and frequency values from said first SDCO to synthesize said clock signals, hardware delays are compensated for by sampling said synthesized clock signals, or derivatives thereof, to generate synthesized clock phase values. The synthesized clock signal phase values are compared with feedback phase values derived from the PLL loop to generate a compensation value to modify the synthesized clock signals or derivatives thereof.

20 Claims, 5 Drawing Sheets

(56) References Cited

U.S. PATENT DOCUMENTS

| | | | |
|---|---|---|---|
| 2011/0077035 A1* | 3/2011 | Charipadi | H03B 27/00 455/507 |
| 2011/0275402 A1* | 11/2011 | Charipadi | H04W 56/0035 455/522 |
| 2015/0326232 A1* | 11/2015 | Rahbar | H03L 7/0991 327/156 |

* cited by examiner

HARDWARE DELAY COMPENSATION IN DIGITAL PHASE LOCKED LOOP

CROSS REFERENCE TO RELATED APPLICATION

This application claims the benefit under 35 USC 119(e) of prior U.S. provisional application No. 62/140,475, filed Mar. 31, 2015, the contents of which are herein incorporated by reference.

FIELD OF THE INVENTION

This invention relates to the field of precision timing, and in particular to a method and apparatus for compensating for hardware delays in a digital phase locked loop (DPLL), in particular for effecting input/output (I/O) phase alignment control.

BACKGROUND OF THE INVENTION

A DPLL is used to create an output signal synchronized in both phase and frequency to a reference signal. A PLL loop including a software-implemented digital controlled oscillator (SDCO) may be used to generate phase and frequency control values for a hardware-implemented controlled oscillator that generates the output clock signal. The PLL loop comprises a phase sampler that samples the phase of reference signals. The SDCO computes the phase and frequency of output clock signal locked to the input reference signal for each cycle of a system clock running the DPLL. An SDCO is used in a software implementation of a Digital Controlled Oscillator (DCO), which offers advantages in terms of flexibility, accuracy, stability and reliability. The SDCO is basically a numerical DCO with selectable precision. Since an SDCO is not limited by hardware, it has an arbitrary precision determined by the software.

The phase and frequency values output by the SDCO must be turned into actual clock signals. This operation is achieved by a hardware-implemented controlled oscillator.

A typical prior art DPLL is shown in FIG. 1. This includes a PLL loop 17 comprising a phase sampler 10 receiving reference input signal ref a phase comparator 12 in the form of a subtractor (an adder with a minus input), a loop filter 14, an SDCO 16, and a converter 18. The converter 18 is coupled to a hardware-implemented oscillator 20, which synthesizes the output clock signals. The hardware-implemented controlled oscillator 20 may be a digital controlled oscillator (DCO) or a voltage controlled oscillator (VCO). In the event that a DCO is utilized, an APLL is normally provided to control an ultimate VCO responsive to the DCO. The DCO/VCO 20 will typically be mounted on a separate die to generate clock signals for an active circuit so as to reduce output clock noise by isolation the SPLL from the real clock output.

The phase sampler 10 generates a digital phase value representing the current phase of the reference signal ref. This is compared in comparator 12 with the phase value output by the SDCO 16 to generate a phase error value. This is passed through the loop filter 14 to generate a control value for the SDCO 16. The control value is in the form of a frequency offset df, which is applied for the amount of time necessary to bring the output of the SDCO back into phase with the reference signal. The loop filter for a type II PLL is shown in more detail in FIG. 5 and as is known in the art comprises a proportional path and an integral path including an integrator. The proportional path includes multiplier 60, which multiplies the phase error value by a parameter Cp (the p parameter) to define the desired filter bandwidth. The integral path includes a multiplier 62, which multiplies the output of multiplier 60 by an integral parameter Ci (the i-parameter), and an adder 64 with a feedback loop including a unit delay module 66 to provide an integrator. An output adder 68 adds the outputs of adder 60 and 62 to produce the frequency offset df.

The SDCO 18 generates phase and frequency values that are passed to converter 18, which converts them to a suitable form for controlling the phase and frequency inputs of the hardware-implemented DCO/VCO 20. The converter 18 takes into account the fact that SDCO16 is a software device and DCO 20 is a hardware device. For example, the SDCO 16 and DCO 20 may have different center frequencies or different bit widths. Normally, SDCO 16 is a numerical DCO and has much higher resolution than hardware DCO 20. The converter 18 is thus a map, typically a linear map, from one frequency to another one with different resolutions, or bit widths.

Since the SDCO 16 is locked to the sampled reference phase value, and the SDCO 16 controls the output of the DCO/VCO 20, the output clock signal is synchronized with the input reference signal. However, it will be appreciated that the fact that the output clock is synchronized in frequency and phase with the reference clock does not necessary mean that it is in alignment with the reference clock as there may be a constant phase difference between the two clocks.

In many applications, it is required that not only is the output clock locked in frequency and phase with the reference, but also that its phase be aligned in time with the reference clock. In a DPLL, the phase alignment of the DCO/VCO 20 output clock can in theory be achieved ensuring that the SDCO 16 and DCO/VCO 20 both run on the same system clock and then directly controlling the output phase of the DCO/VCO 20 with the output phase value generated by the SDCO 16. However, if there is any hardware delay between the SDCO 16 and the DCO/VCO 20 or at the DCO/VCO 20 output pads, this may cause loss of alignment to occur. Moreover, any variation in temperature, environment or output frequency can cause the hardware delay to vary.

SUMMARY OF THE INVENTION

According to the present invention there is provided a digital phase locked loop comprising a PLL loop, the PLL loop comprising a first phase sampler for sampling a reference signal to generate a reference signal phase value, a first software-implemented controlled oscillator (SDCO) responsive to a control value to generate output phase and frequency values locked to the reference input signal, a first phase comparator for comparing said reference signal phase values with a feedback phase value derived from said PLL loop to generate a phase error value, and a loop filter for filtering said error phase value to derive said control value; a hardware-implemented controlled oscillator responsive to output phase and frequency values from said first SDCO to synthesize clock signals, said synthesized clock signals, or derivatives thereof, being subject to a hardware delay; and a hardware delay compensation loop including a second phase sampler for sampling said synthesized clock signals, or derivatives thereof, to generate a synthesized clock signal phase value, a second phase comparator for comparing said synthesized clock signal phase value with a feedback phase value derived from said PLL loop to generate a compensation value to modify said synthesized clock signals or derivatives thereof to compensate for said hardware delay.

As used herein the term value is used to describe software variables representing physical parameters, such as frequency and phase. Within the PLL loop the internal variables are values, whereas the reference input and output clock are physical signals.

The feedback values for both phase comparators can in theory be obtained from the output of the first SDCO, but since the phase samplers, the first SDCO and hardware-implemented controlled oscillator employ modulo operations, it is desirable to have the modulo operations, i.e. the time when the wrap-around occurs, happen at the same time. This result is difficult to achieve for three clocks, namely the reference clock, the output signals, and the SDCO, but it is relatively easy to achieve for pairs of clocks.

Consequently, in a preferred embodiment, two additional SDCOs are coupled to the output of the loop filter to generate the feedback phase values respectively for the first and second phase samplers. In this way it possible to arrange for the modulo operations for the clocks and their respective inputs to occur at the same time.

One embodiment has multiple output clocks multiplexed to the input of the hardware delay compensation loop. Another embodiment has a single hardware-implemented controlled oscillator feeding multiple pattern shifters that generate different output signals. In this embodiment the different output signals are multiplexed to the input of the hardware delay compensation loop.

In another aspect the invention provides a method of compensating for hardware delays in synthesized clock signals in a digital phase locked loop comprising a PLL loop including a first software-implemented controlled oscillator (SDCO) responsive to a control value to generate output phase and frequency values locked to a reference input signal, and a hardware-implemented controlled oscillator responsive to output phase and frequency values from said first SDCO to synthesize said clock signals, the method comprising sampling said synthesized clock signals, or derivatives thereof, to generate synthesized clock phase values; comparing said synthesized clock signal phase values with feedback phase values derived from said PLL loop to generate a compensation value to modify said synthesized clock signals or derivatives thereof.

BRIEF DESCRIPTION OF THE DRAWINGS

This invention will now be described in more detail, by way of example only, with reference to the accompanying drawings, in which:—

DETAILED DESCRIPTION OF THE PREFERRED EMBODIMENTS

Figure 1:
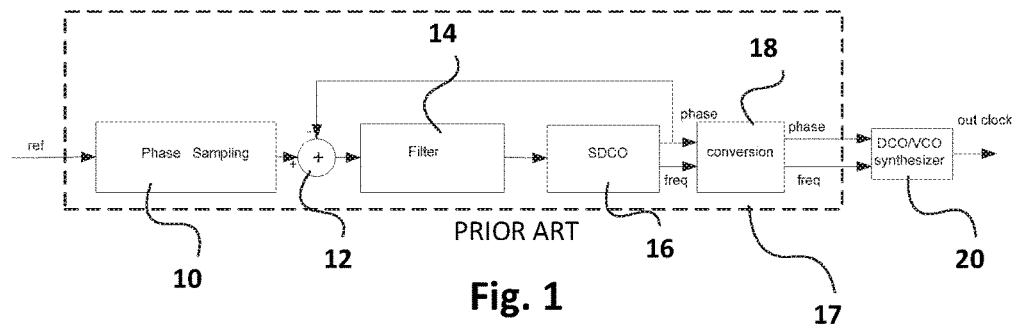
FIG. 1 shows a prior art DPLL.

In the drawings like parts are designated by like or similar reference numerals.

An embodiment of the invention showing how a hardware delay compensation loop 40 is employed to achieve alignment control will now be described with reference to FIG. 2. The DPLL shown in FIG. 2 comprises a DPLL as shown in FIG. 1 with additional components, namely a second phase sampler 24, a second phase comparator 26, a controllable digital feedback filter 28, an adjustment module 30, a switch 32, and a phase compensator 34. Feedback filter 28 receives a control input, signal ctr, to: start it; reset it; and output the delay result. The SDCO 16 and feedback filter 28 are responsive to periodic hardware interrupts to present their respective outputs. For clarity the time between interrupts is denoted Ti Second phase sampler 24, second phase comparator 26, controllable feedback filter 28, and adjustment module 30 together form the hardware delay compensation loop 40 for generating a compensation value for application to the output of the conversion unit 18 to compensate for the hardware delay between the output of the DCO/VCO 20 and the clock output represented in FIG. 2 by block 22. This compensation is used to effect phase alignment control. The hardware delay may appear at the output pads of the DCO/VCO 20.

The phase sampler 24 samples the output of the DCO/VCO 20, which is delayed by an amount equal to the hardware delay represented by block 22, and the resulting phase value is compared with the phase fed back from the SDCO 16 in second phase comparator 26. The phase difference at the output of the second comparator 26 is applied to the feedback filter 28, which filters the phase difference, and outputs a filtered phase delay, i.e. the phase delay incurred by block 22, which is applied to the input of adjustment module 30.

The adjustment module 30 computes a frequency offset value df and a time T for which the frequency offset value df should be applied to the frequency input DCO/VCO 20 by being added to the frequency value output by SDCO 16 in adder 36.

The value for df is limited by the amount of clock movement allowed per second, and therefore calculation of a value for df and T is directly achievable. For example, a predetermined choice of values for df may be stored, and the appropriate T selected in cooperation with a df from the choice of values, to achieve the required phase compensation. The resultant phase change per second is equal to the DCO frequency offset df.

The feedback filter 28 can be a simple average filter to remove any noise in the phase error output by the second comparator 26. The control input for feedback filter 28 is generated by an external controller, which is operative to select the type and operation of feedback filter 28 and optionally to gate the output of feedback filter 28 so as not to appear until its output is valid.

Normally the switch 32 is set at the "0" or inactive location when no phase delay is present. When a phase delay is detected, the frequency of the DCO/VCO is offset by the amount df for T seconds to compensate for the detected phase delay. When the frequency offset has been applied for the required amount of time T, the switch 32 is returned to the zero position.

The time T is computed in the adjustment module 30 from the filtered phase delay output by the feedback filter 28. For example, if the hardware delay is 10 ns, the output clock can be aligned by moving it forward by 10 ns. This can be achieved by applying the frequency offset df, which is equivalent to the phase change per second, for the appropriate period of time T to achieve the phase compensation by adding it to the frequency output of the conversion module 18 in adder 36. For example, if the averaged phase offset is δφ in ns, then $$\delta\phi = df \times T$$

In many cases, it is undesirable for the phase of the DCO/VCO 20 to be changed too rapidly. By applying the frequency offset df to the DCO/VCO 20 for a time T sec, determined by the adjustment module 30, the total phase change of the output clock is df×T. This frequency offset df is added to the frequency output of conversion unit 18 in adder 36 for time T.

At each periodic interrupt, the exact phase movement caused by the applied df over time Ti, i.e. the time from the last periodic input, is known. The phase compensator 34, compensates the output phase of the DCO/VCO 20 by this amount, namely by df ×Ti on each interrupt, and adds it to the phase output of conversion unit 18 in adder 38. Phase compensator 34 accumulates these phase changes, and applies the total accumulated phase change to adder 38. Phase compensator 34 is required since SDCO 16 continuously attempts to control the phase of DCO/VCO 20 without knowledge of the operation of hardware delay compensation loop 40, and thus the accumulated phase change implemented by hardware delay compensation loop 40 must be gradually, over the various interrupts until time T is achieved, added to the phase instructed by SDCO 16.

In the embodiment described with reference to FIG. 2, as indicated above, the delay-corrected output of the DPLL is taken from the input to the phase sampler 24 of the hardware control correction circuit 40.

Figure 3:
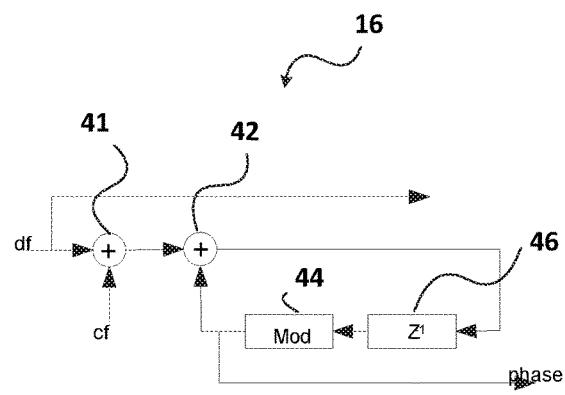
FIG. 3 is a block diagram of an SDCO.
Figure 5:
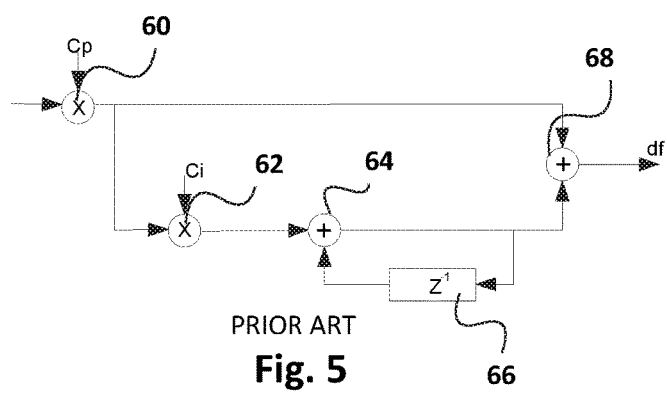
FIG. 5 is a block diagram of a prior art DPLL filter.

The SDCO block 16 is shown in more detail in FIG. 3 and comprises adders 41, 42, modulo accumulator 44, which accumulates the phase, modulo a certain value, and unit delay module 46. The SDCO 16 continuously accumulates phase based on its frequency inputs cf and df, where cf is the center frequency of the SDCO and df is frequency offset.

Figure 4:
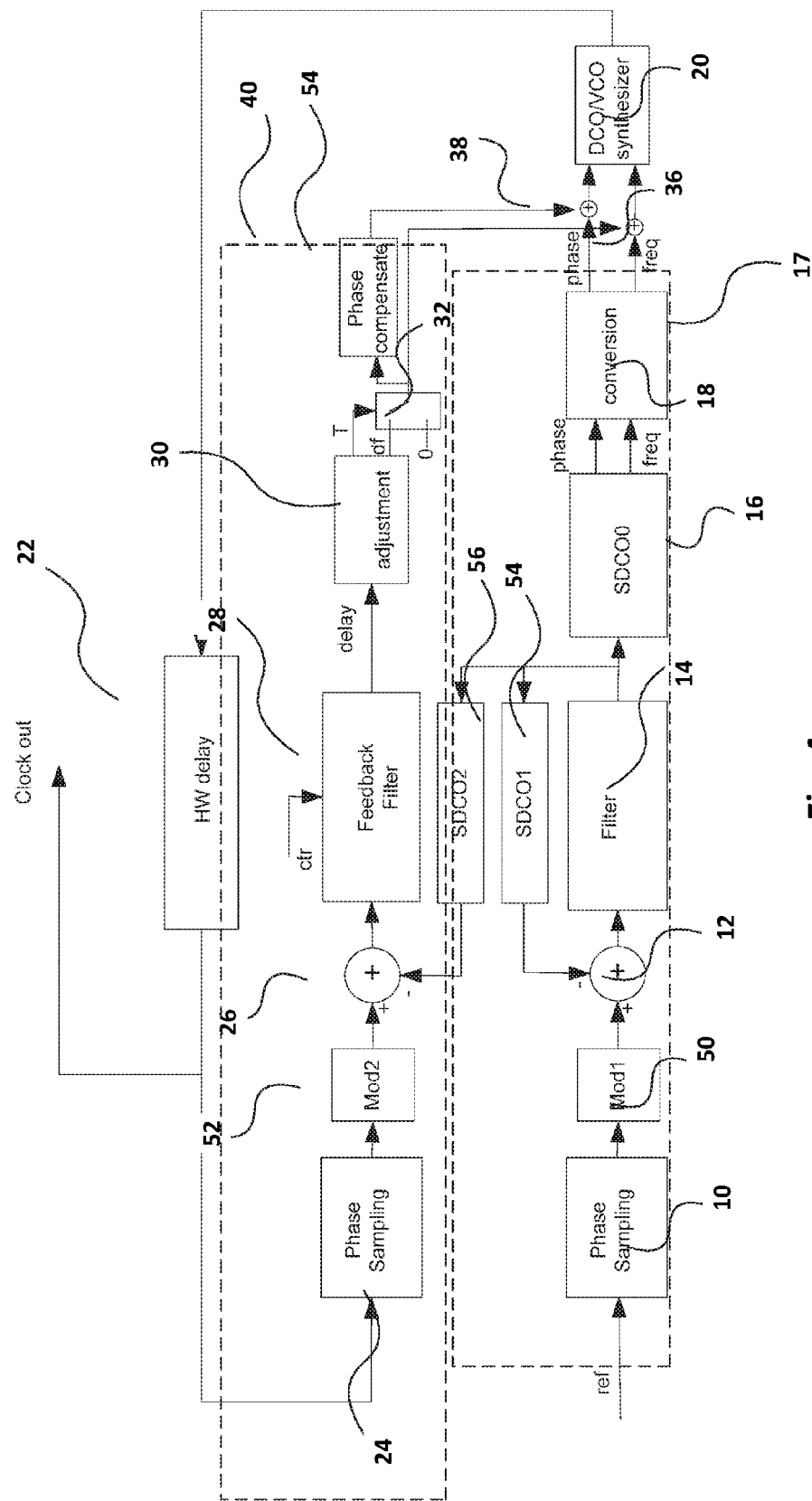
FIG. 4 is a block diagram of a DPLL with a hardware delay compensation loop and separate SDCOs in accordance with an embodiment of the invention.

The phase cannot increase indefinitely and has to be wrapped around after certain time. This wrap around, or modulo operation, is shown in FIG. 3. Likewise, the input phase output by the phase samplers 10 and 24 cannot increase indefinitely and has to be wrapped around after a certain time. This is represented in FIG. 4 by modulo blocks 50, 52. In order to match up with reference input phase, the modulo operation or wrap around in all three clocks, the reference input, the feedback clock, and the SDCO has to occur at exactly the same time. Also, in order to avoid any phase error accumulation during the modulo operation, the wrap around should happen on an exact integer number of SDCO clock pulses and input reference pulses.

Since the reference frequency and output feedback frequency can be completely different, it can be difficult to find a common modulo value for all three clocks, namely the reference, SDCO output and feedback signal. It is however relatively easy to find a common modulo value for two clocks. This leads to the architecture shown in FIG. 4, where SDCO1 has the same modulo value as the reference clock, SDCO2 has the same modulo value as the feedback clock and SDCO0 is has the same modulo value as the hardware-implemented DCO/VCO 20.

Figure 2:
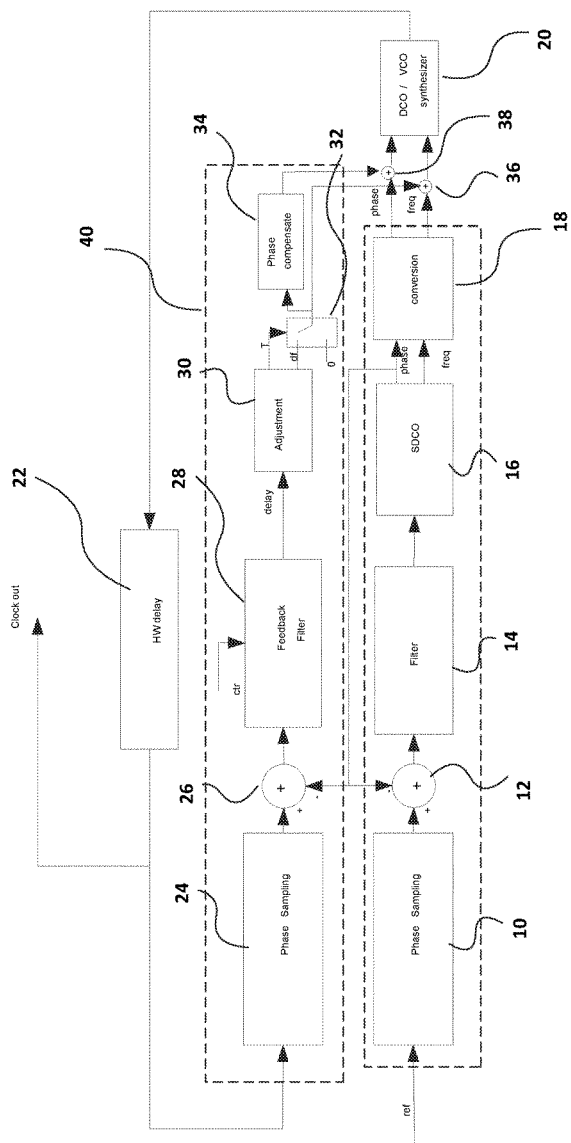
FIG. 2 is a block diagram of DPLL with a hardware delay compensation loop in accordance with an embodiment of the invention.

The arrangement shown in FIG. 4 is the similar to that shown in FIG. 2. The modulo blocks 50, 52 represent the inherent modulo operations performed by the phase samplers. Instead of the feedback phase value being obtained from the SDCO 16, a separate feedback phase value is obtained from respective additional SDCOs, namely SDCO1 54 and SDCO2 56 for each phase comparator 12, 26.

In this embodiment SDCO1 54 and SDCO2 56 are coupled to the output of filter 14. The phase of the input reference signal accumulated modulo a first value is compared with the output of SDCO1 54, while the phase of the delayed output signal accumulated modulo a second value is compared with the output of SDCO2 56.

In this embodiment the modulo value of the phase sampler 10 can be made the same as that for the accumulator in the SDCO01 54, the modulo value of the phase sampler 24 can be made the same as the accumulator in SDCO2 56, and the modulo value of the accumulator in the SDCO0 16 can be made the same as an accumulator in the DCO/VCO synthesizer 20.

Figure 6:
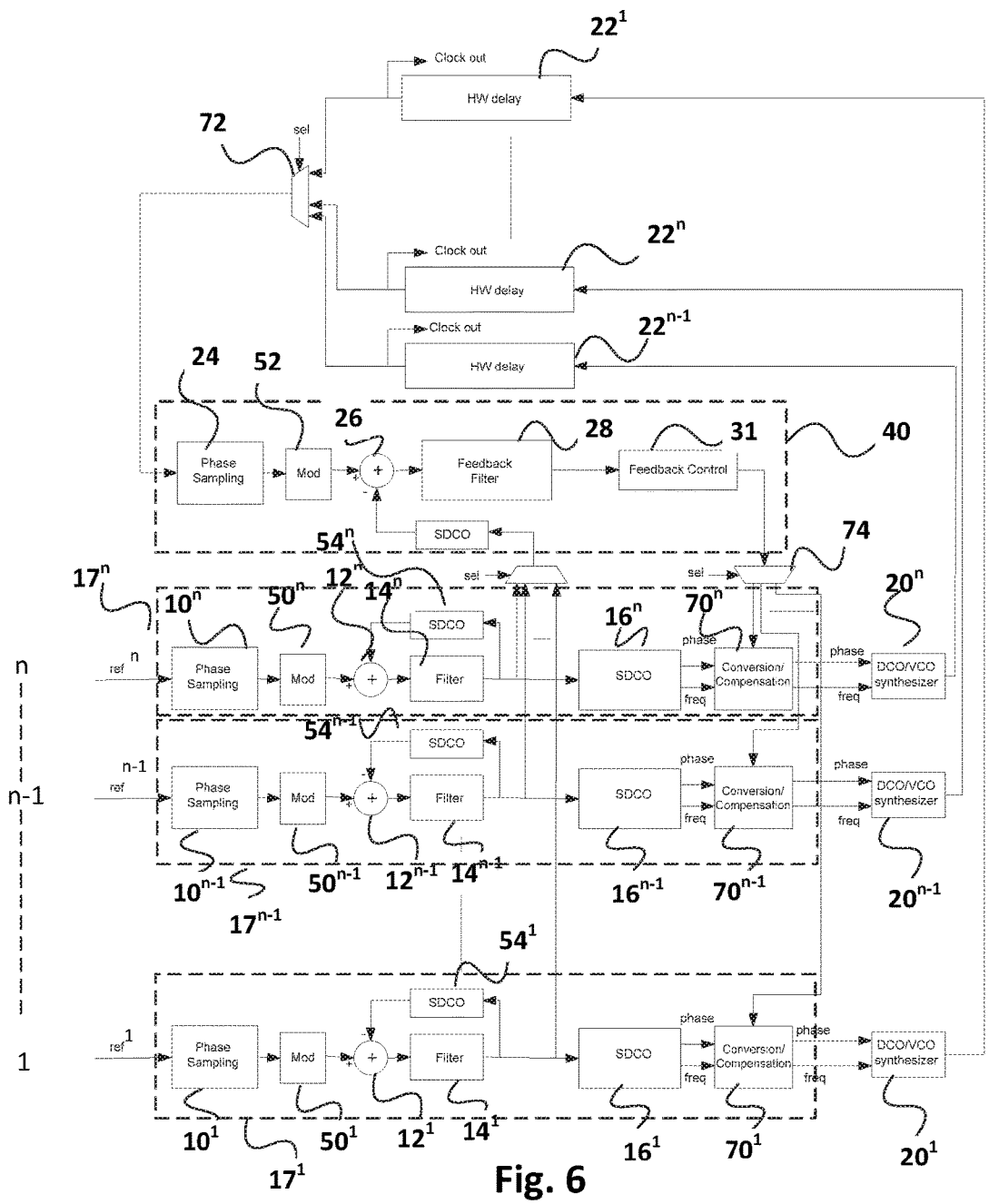
FIG. 6 is a block diagram of a multi-input and multi-output DPLL with a hardware delay compensation loop in accordance with an embodiment of the invention for a multiple synthesis hardware DCO.

The architecture shown in FIG. 4 can be scaled up to a multi input/output PLL architecture as shown in FIG. 6. In this embodiment there are n reference inputs $ref^1$ to $ref^n$. The components corresponding to those in FIG. 4 are designated by similar reference numerals with a superscript from 1 . . . n designating the respective PLL loops $17^1$ . . . $17^n$. In this Figure the control adjustment block 30, switch 32, and phase compensation block 34 of FIG. 4 are shown combined into single a single feedback control block 31. The conversion block 18, adders 36, 38 and phase compensation unit 34 of FIG. 4 are shown combined into single conversion/compensation blocks $70^1$ . . . $70^n$. For simplicity, the frequency and phase compensation lines are shown as a single line.

In FIG. 6, the individual PLL loops $17^1$ . . . $17^n$ and hardware delay compensation loop 40 operate in a similar manner to that of FIG. 4.

The input to the phase sampler 24 of the hardware delay compensation loop 40 comes from the output of one of the DCO/VCO synthesizers $20^1$ . . . $20^n$ selected by the multiplexer 72. The output of the hardware delay compensation loop 40 is then applied to the conversion circuit $70^1$ . . . $70^n$ of the corresponding PLL loop $17^1$ . . . $17^n$ by the multiplexer 74. The selection signal sel applied to the multiplexers 72, 74 can, for example, be obtained from a simple modulo n counter (not shown) to sequentially cycle through the different inputs, or an I/O alignment circuit can be used to cycle around all synthesis output clocks with a state machine and MUX control to maintain the right alignment for all outputs.

Figure 7:
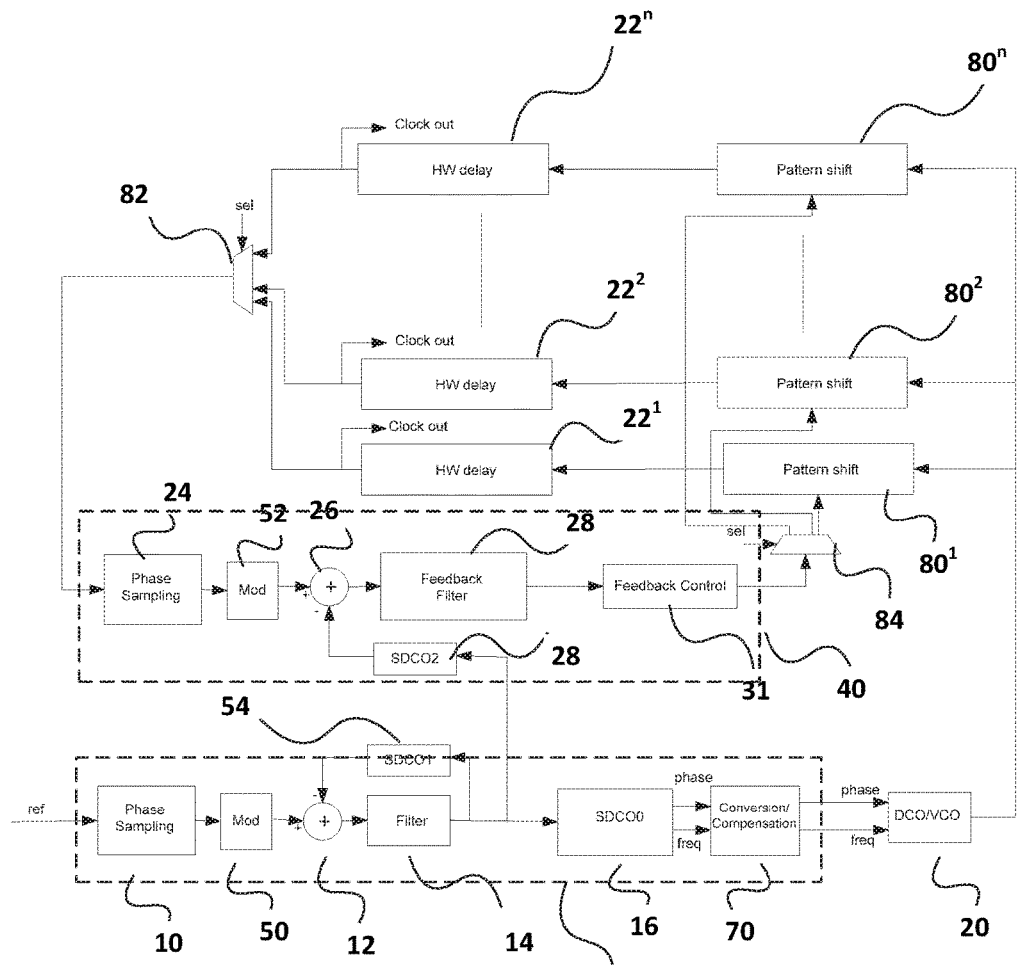
FIG. 7 is a block diagram of a DPLL with multiple clock outputs using a single hardware DCO synthesizer.

FIG. 7 shows an arrangement with a single reference input and multiple outputs with a single hardware-implemented DCO. The hardware correction controller is similar to that shown in FIG. 4 as is the basic PLL loop 17.

In this embodiment the output of the single DCO/VCO 20 is applied to a series of "pattern shifters" $80^1$, $80^2$ . . . $80^n$, which generate different frequencies, typically multiples or sub-multiples, of the frequency generated by the single DCO/VCO 20. Generally, the pattern shifters consist of an integer divider and multiplier to generate a frequency (N/m)*fdco, where fdco is the output frequency of the DCO/VCO. In most applications the pattern shifter is a simple divider.

The outputs of the pattern shifters $80^1 \ldots 80^n$ are applied to multiplexer 82 after experiencing respective hardware delays $22^1 \ldots 22^n$. This selects an output for application to the hardware correction controller 40. The multiplexer 82 can be controlled by a modulo n counter to cycle through the pattern shifters $80^1 \ldots 80^n$. The corrected clock outputs in this arrangement are taken from the inputs to the multiplexer 82.

In the embodiment of FIG. 7, instead of controlling the frequency of the single DCO/VCO 20 as shown in FIG. 6, the output of the hardware correction controller 40 is applied to the respective pattern shifters $80^1 \ldots 80^n$ by multiplexer 84, which selects the pattern shifter $80^1 \ldots 80^n$ whose output is currently selected by the multiplexer 82, since they are both responsive to the same selection signal sel.

Figure 8:
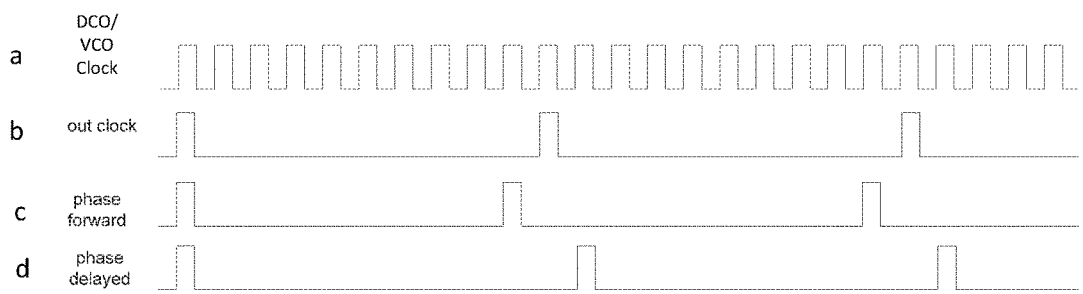
FIG. 8 is a timing chart showing phase movement by VCXO pattern shift control signal.

The hardware compensation delay loop 40 generates an output value that in this example causes the selected pattern shifter to move a generated clock pulse forwards or backwards by an integer number of cycles of the output of the DCO/VCO 20 to compensate for the delay. This mechanism is illustrated in FIG. 8, where line a shows the output of the DCO/VCO 20 and line b shows the output of one of the pattern shifters $80^1 \ldots 80^n$. In this example, the DCO/VCO frequency is divided by 10.

In order to correct the phase of the output clock the output of the pattern shifter is moved forward (line c) or back (line d), in this example, by a single cycle of the DCO/VCO output clock to achieve the necessary phase correction. The output of the phase shifter could be moved by more than one clock cycle if necessary.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included. The functional blocks or modules illustrated herein may in practice be implemented in hardware or software running on a suitable processor.

The invention claimed is:

1. A digital phase locked loop (PLL) comprising:
    a PLL loop comprising:
        a first phase sampler for sampling a reference signal to generate reference signal phase values,
        a first software-implemented controlled oscillator (SDCO) responsive to control values to generate output phase and frequency values locked to the reference signal,
        a first phase comparator for comparing said reference signal phase values with feedback phase values derived from said PLL loop to generate phase error values, and
        a loop filter for filtering said phase error values to derive said control Values;
    a hardware-implemented controlled oscillator responsive to output phase and frequency values from said first SDCO to synthesize clock signals, said synthesized clock signals, or derivatives thereof, being subject to a hardware delay; and
    a hardware delay compensation loop including a second phase sampler for sampling said synthesized clock signals, or derivatives thereof, to generate synthesized clock signal phase values, and a second phase comparator for comparing said synthesized clock signal phase values with feedback phase values derived from said PLL loop to generate a compensation value to modify said synthesized clock signals to compensate for said hardware delay.

2. The digital phase locked loop as claimed in claim 1, wherein said first and second phase comparators are coupled to the output of said first SDCO to obtain said feedback phase values for both said first and second phase comparators.

3. The digital phase locked loop as claimed in claim 1, wherein said PLL loop further comprises a second SDCO coupled to the output of said loop filter to generate said feedback phase values for said first phase comparator, and said hardware delay compensation loop further comprises a third SDCO coupled to the output of said loop filter to generate said feedback phase values for said second phase comparator.

4. The digital phase locked loop as claimed in claim 3, wherein said hardware-implemented controlled oscillator, and said first and second phase samplers, and each of said first, second and third SDCOs operate modulo certain values, the modulo value of said first SDCO being the same as the modulo-value of said hardware-implemented controlled oscillator, the modulo value of said second SDCO being the same as the modulo value of said first phase sampler, and the modulo value of said third SDCO being the same as the modulo value of said second phase sampler, the modulo operations of components with the same modulo value being arranged to occur at the same time.

5. The digital phase locked loop as claimed in claim 3, wherein said hardware delay compensation loop further comprises a feedback controller for shifting the phase and/or frequency of the synthesized clock signals.

6. The digital phase locked loop as claimed in claim 5, wherein said feedback controller comprises an adjustment module for computing said compensation value as an offset frequency df and a time T for applying said offset frequency df, and a switch controlled by said adjustment module to apply said offset frequency df to the input of the hardware-implemented controlled oscillator for said time T as a correction value to said output frequency values generated by said first SDCO.

7. The digital phase locked loop as claimed in claim 6, wherein said hardware delay compensation loop further comprises a phase compensator for shifting the output of the hardware-implemented controlled oscillator by an amount df×T on each periodic hardware interrupt.

8. The digital phase locked loop as claimed in claim 3, comprising multiple said PLL loops for receiving respective reference input signals, a first multiplexer for applying a selected one of the respective hardware-implemented controlled oscillators to said second phase sampler, and a second multiplexer for applying said compensation value to the respective hardware-implemented controlled oscillator currently selected by said first multiplexer.

9. The digital phase locked loop as claimed in claim 3, wherein said hardware delay compensation loop includes a feedback filter in the form of an averaging filter.

10. The digital phase locked loop as claimed in claim 3, further comprising a series of pattern shifters coupled to said hardware-implemented controlled oscillator to generate a series of different output frequencies derived from said synthesized clock signals, a first multiplexer for selecting an output of one of said pattern shifters for application to said second phase comparator, and a second multiplexer for applying said compensation value to the pattern shifter selected by said first multiplexer to shift the output thereof by one or more cycles of said synthesized clock signals.

11. A method of compensating for hardware delays in synthesized clock signals in a digital phase locked loop (PLL) comprising a PLL loop including a first software-implemented controlled oscillator (SDCO) responsive to a control value to generate output phase and frequency values locked to a reference input signal, and a hardware-implemented controlled oscillator responsive to said output phase and frequency values from said first SDCO to synthesize said clock signals, the method comprising:
    sampling said synthesized clock signals, or a derivative thereof, to generate synthesized clock phase values;
    comparing said synthesized clock phase values with feedback phase values derived from said PLL loop to generate compensation values to modify said synthesized clock signals.

12. The method as claimed in claim 11, wherein said feedback phase values compared with said synthesized clock phase values are obtained from the output of said first SDCO.

13. The method as claimed in claim 11, wherein feedback phase values for said PLL loop are obtained from a second SDCO coupled to an output of a loop filter in said PLL loop, and said feedback phase values compared with said synthesized clock signal phase values are obtained from the output a third SDCO coupled to the output of said loop filter.

14. The method as claimed in claim 13, wherein first and second phase samplers sample respectively the reference input signal and said synthesized clock signals, or derivatives thereof, and said hardware-implemented controlled oscillator and first and second phase samplers operate modulo certain values, said first, second and third SDCOs operate modulo certain values, the modulo value of said first SDCO being the same as the modulo value of said hardware-implemented controlled oscillator, the modulo value of said second SDCO being the same as the modulo value of said first phase sampler, and the modulo value of said third SDCO being the same as the modulo value of said second phase sampler, the modulo operations of components with the same modulo value occurring at the same time.

15. The method as claimed in claim 14, further comprising computing said compensation value as an offset frequency df and time T for applying said offset frequency df, and applying said offset frequency df to the hardware-implemented controlled oscillator for said time T as a correction value to said output frequency value generated by said first SDCO.

16. The method as claimed in claim 15, further comprising shifting the phase of the hardware-implemented controlled oscillator by an amount df×T on each periodic, where T represents the interrupt interval.

17. The method as claimed in claim 13 in a digital PLL comprising multiple said PLL loops for receiving respective reference signals and generating multiple synchronized clock signals, said method comprising sampling selected ones of said synthesized clock signals to derive said compensation value, and applying said respective compensation value to the respective hardware-implemented controlled oscillator generating the selected synthesized clock signals.

18. The method as claimed in claim 17, wherein the synchronized clock signals are selected in sequence.

19. The method as claimed in claim 13, further comprising generating a series of different output frequencies derived from said synthesized clock signals with respective pattern shifters, selecting an output of one of said pattern shifters subject to a delay to generate said compensation value, and applying said compensation value to the selected pattern shifter to shift the output thereof by one or more cycles of said synthesized clock signals.

20. The method as claimed in claim 11, further comprising filtering the result of comparing said synthesized clock phase values with feedback phase values with a feedback filter in the form of an averaging filter.

* * * * *